United States Patent
Samonji et al.

(10) Patent No.: US 8,422,526 B2
(45) Date of Patent: Apr. 16, 2013

(54) SEMICONDUCTOR LASER DEVICE AND METHOD FOR MANUFACTURING THE SAME

(75) Inventors: Katsuya Samonji, Osaka (JP); Masao Kawaguchi, Osaka (JP); Hideki Kasugai, Osaka (JP)

(73) Assignee: Panasonic Corporation, Osaka (JP)

( * ) Notice: Subject to any disclaimer, the term of this patent is extended or adjusted under 35 U.S.C. 154(b) by 392 days.

(21) Appl. No.: 12/745,385

(22) PCT Filed: Oct. 14, 2009

(86) PCT No.: PCT/JP2009/005359
§ 371 (c)(1), (2), (4) Date: May 28, 2010

(87) PCT Pub. No.: WO2010/067500
PCT Pub. Date: Jun. 17, 2010

(65) Prior Publication Data
US 2011/0051765 A1    Mar. 3, 2011

(30) Foreign Application Priority Data
Dec. 10, 2008    (JP) .................................. 2008-314375

(51) Int. Cl.
*H01S 5/00* (2006.01)
(52) U.S. Cl.
USPC ..................... 372/45.01; 372/46.01; 438/492; 257/E21.09
(58) Field of Classification Search ................ 372/45.01
See application file for complete search history.

(56) References Cited

U.S. PATENT DOCUMENTS

| | | | |
|---|---|---|---|
| 2004/0094773 A1* | 5/2004 | Kiyoku et al. | ................. 257/103 |
| 2006/0131590 A1* | 6/2006 | Takakura et al. | ................ 257/79 |
| 2008/0240190 A1 | 10/2008 | Kuramoto et al. | |
| 2008/0247433 A1 | 10/2008 | Tsuchiya et al. | |
| 2009/0011530 A1* | 1/2009 | Ito et al. | ............................ 438/32 |
| 2010/0080107 A1 | 4/2010 | Koda et al. | |

FOREIGN PATENT DOCUMENTS

| | | |
|---|---|---|
| JP | 63-196088 | 8/1988 |
| JP | 2003-198057 A | 7/2003 |
| JP | 2007-281527 | 10/2007 |
| JP | 2008-244423 | 10/2008 |
| JP | 2008-258456 A | 10/2008 |
| JP | 2008-294344 A | 12/2008 |
| JP | 2010-087083 A | 4/2010 |
| WO | WO 2009/057254 A1 | 5/2009 |

* cited by examiner

*Primary Examiner* — Xinning Niu
(74) *Attorney, Agent, or Firm* — McDermott Will & Emery LLP

(57) ABSTRACT

A semiconductor laser device includes a semiconductor multilayer structure selectively grown on a substrate other than on a predetermined region of the substrate. The semiconductor multilayer structure includes an active layer, and has a stripe-shaped optical waveguide extending in a direction intersecting a front facet through which light is emitted. The active layer has an abnormal growth portion formed at a peripheral edge of the predetermined region, and a larger forbidden band width portion formed around the abnormal growth portion and having a larger width of a forbidden band than that of a portion other than the abnormal growth portion of the active layer. The optical waveguide is spaced apart from the abnormal growth portion and includes the larger forbidden band width portion at the front facet.

19 Claims, 3 Drawing Sheets

SEMICONDUCTOR LASER DEVICE AND METHOD FOR MANUFACTURING THE SAME

RELATED APPLICATIONS

This application is the U.S. National Phase under 35 U.S.C. §371 of International Application No. PCT/JP2009/005359, filed on Oct. 14, 2009, which in turn claims the benefit of Japanese Application No. 2008-314375, filed on Dec. 10, 2008, the disclosures of which applications are incorporated by reference herein.

TECHNICAL FIELD

The present invention relates to semiconductor laser devices and methods for manufacturing the semiconductor laser devices, and more particularly, to nitride semiconductor laser devices having a facet window structure and methods for manufacturing the semiconductor laser devices.

BACKGROUND ART

Semiconductor laser devices employing a nitride semiconductor, typified by gallium nitride (GaN), are important elements which are used as, for example, light sources for high-density optical disk apparatuses, typified by Blu-ray™ disk apparatuses, light sources for laser display apparatuses, and the like. Blu-ray™ disk apparatuses employ blue-violet light having a wavelength of about 405 nm, while laser display apparatuses employ blue light having a wavelength of about 450 nm. In the field of optical disk apparatuses, there is a demand for light output of several hundred milliwatts for the purpose of an improvement in recording speed and an improvement in reliability of multilayer recording. In the field of laser display apparatuses, there is a demand for light output of several watts for the purpose of an improvement in the luminance of the screen.

Formation of the cavity facet is important in extracting high-power laser light from a semiconductor laser device. The cavity facet is typically formed by cleavage of crystal. Therefore, a high density of dangling bonds (or unsaturated bonds) is formed on the facet. The dangling bond functions as a nonradiative recombination center. In the facet portion, because carriers injected in the active layer are lost at the nonradiative recombination centers, heat is locally generated to a higher degree in the facet portion than in an inner portion of the cavity. An increase in temperature due to the heat generation reduces the width of the forbidden band in the facet portion, and therefore, oscillating laser light which bounces back and forth in the cavity is absorbed by the facet portion. Because the absorbed oscillating laser light increases the temperature of the facet portion, the width of the forbidden band is further reduced. The reduction of the width of the forbidden band due to the heat generation and the increase of the light absorption repeatedly occur, resulting in a local increase in temperature at the facet portion which is accompanied by melting of crystal. This phenomenon is called catastrophic optical damage (COD).

There is a known structure called a facet window structure, in which the width of the forbidden band of the active layer is larger at the facet portion of the cavity than at the inner portion of the cavity so that COD is reduced or prevented. Formation of the facet window structure can effectively reduce or prevent light absorption at the facet portion, resulting in reduction or prevention of the local temperature increase. For gallium arsenide (GaAs)-based laser devices, the facet window structure is implemented by a technique of amorphizing the active layer by diffusing or ion-implanting an impurity (see, for example, Patent Document 1). For example, in the case of the impurity diffusion technique, a metal impurity layer containing zinc (Zn) or the like having a large diffusion constant is formed in a portion corresponding to the facet portion, and the metal impurity is thermally diffused to the active layer. As a result, a region around the active layer is amorphized to form the facet window structure having a large width of the forbidden band.

CITATION LIST

Patent Document

PATENT DOCUMENT 1: Japanese Patent Laid-Open Publication No. S63-196088

SUMMARY OF THE INVENTION

Technical Problem

However, it is difficult to apply, to GaN-based semiconductor laser devices, the technique of forming the facet window structure by diffusing or ion-implanting an impurity. Because nitride semiconductors, such as GaN and the like, have a strong bond between gallium (Ga) and nitrogen (N) in its crystalline state, the diffusion or ion-implantation of an impurity is less likely to cause amorphization at a region around the active layer. Therefore, for laser devices employing a nitride semiconductor, the facet window structure has not yet been put to practical use.

It is an object of the present disclosure to solve the aforementioned problems, and allow formation of the facet window structure without diffusing or ion-implanting an impurity, thereby achieving a semiconductor laser device having the facet window structure, even when a nitride semiconductor is employed.

Solution to the Problem

To achieve the aforementioned object, an example semiconductor laser device includes a semiconductor multilayer structure formed by selective growth using a mask, where a portion having a larger width of the forbidden band than that of a portion contributing to light emission is formed in a region including a front facet of an active layer.

Specifically, the example semiconductor laser device includes a semiconductor multilayer structure selectively grown on a substrate other than on a predetermined region of the substrate. The semiconductor multilayer structure includes a cladding layer of a first conductivity type, an active layer, and a cladding layer of a second conductivity type, and has a stripe-shaped optical waveguide extending in a direction intersecting a front facet through which light is emitted. The active layer has an abnormal growth portion formed at a peripheral edge of the predetermined region, and a larger forbidden band width portion formed around the abnormal growth portion and having a larger width of a forbidden band than that of a portion other than the abnormal growth portion of the active layer. The optical waveguide is spaced apart from the abnormal growth portion and includes the larger forbidden band width portion at the front facet.

The example semiconductor laser device includes the semiconductor multilayer structure formed on the substrate by selective growth using a mask. Therefore, the larger forbidden band width portion having a larger width of the forbidden band than that of the other portion can be formed in a region including the front facet of the active layer without impurity diffusion or the like. Therefore, even when it is difficult to perform amorphization by impurity diffusion or ion implantation, a facet window structure can be formed, whereby COD can be reduced or prevented.

In the example semiconductor laser device, a mask which reduces or prevents the growth of the semiconductor multilayer structure may be formed on the predetermined region of the substrate. In this case, the mask may be made of a dielectric material or a high melting point metal.

In the example semiconductor laser device, the semiconductor multilayer structure may have an opening formed on the predetermined region.

In the example semiconductor laser device, a distance between an end closer to the front facet of the predetermined region and the front facet may be 50 μm or less. A distance between an end closer to the optical waveguide of the predetermined region and a center line of the optical waveguide may be 20 μm or more and 60 μm or less. A length in a direction along the optical waveguide of the predetermined region may be 5 μm or more and 200 μm or less.

In the example semiconductor laser device, the abnormal growth portion may be formed on both lateral sides of the optical waveguide.

In the example semiconductor laser device, the larger forbidden band width portion may be formed in a region including the front facet of the optical waveguide, and in a region including a rear facet opposite to the front facet of the optical waveguide.

In the example semiconductor laser device, the active layer may be a nitride semiconductor layer containing indium. In the example semiconductor laser device, the semiconductor multilayer structure may be made of a nitride semiconductor having a {0001} plane as a main surface. The optical waveguide may be formed in a <1-100> direction.

An example method for manufacturing a semiconductor laser device includes the steps of (a) forming a mask on a predetermined region of a substrate, (b) growing a semiconductor multilayer structure including an active layer on the substrate on which the mask is formed, (c) forming a stripe-shaped optical waveguide spaced apart from a region where the mask is formed, and (d) forming facets facing in a direction intersecting the optical waveguide by cleavage. In step (b), an abnormal growth portion is formed in the active layer at a peripheral edge of the mask due to abnormal growth, and a larger forbidden band width portion having a larger width of a forbidden band than that of a portion other than the abnormal growth portion of the active layer is formed around the abnormal growth portion. In step (c), the optical waveguide is formed so that the optical waveguide is spaced apart from the abnormal growth portion and includes the larger forbidden band width portion. In step (d), the cleavage is performed so that the larger forbidden band width portion is exposed at a front one of the facets, light being emitted through the front facet.

In the example semiconductor laser device manufacturing method, the mask is formed on the predetermined region of the substrate before the semiconductor multilayer structure including the active layer is grown. Therefore, a portion grown in the vicinity of the mask of the active layer is the larger forbidden band width portion in which an abnormal surface morphology is not recognized and which has a larger width of the forbidden band than that of the other portion. By forming the optical waveguide on the larger forbidden band width portion and performing cleavage so that the larger forbidden band width portion is exposed at the front facet, absorption of oscillating laser light at the front facet can be reduced or prevented. Therefore, even when it is difficult to perform amorphization by impurity diffusion or ion implantation, a facet window structure can be formed, whereby COD can be reduced or prevented.

In the example semiconductor laser device manufacturing method, in step (b), a cladding layer of a first conductivity type may be formed between the substrate and the active layer, and a cladding layer of a second conductivity type may be formed on the active layer, and in step (c), a stripe-shaped ridge may be formed by selectively etching the cladding layer of the second conductivity type. Alternatively, in step (b), a cladding layer of a first conductivity type may be formed between the substrate and the active layer, and a lower cladding layer of a second conductivity type and a current blocking layer may be successively formed on the active layer, the lower cladding layer of the second conductivity type being lower than the current blocking layer, and in step (c), a stripe-shaped opening may be formed by selectively etching the current blocking layer before an upper cladding layer of the second conductivity type may be formed and embedded in the opening.

The example semiconductor laser device manufacturing method may further includes the step of (e) after step (b), removing the mask.

In the example semiconductor laser device manufacturing method, in step (b), the semiconductor multilayer structure may be grown so that an opening is formed on the mask.

In the example semiconductor laser device manufacturing method, the mask may be made of a dielectric material or a high melting point metal.

In the example semiconductor laser device manufacturing method, in step (a), a distance between an end closer to the front facet of the mask and the front facet may be 50 μm or less, a distance between an end closer to the optical waveguide of the mask and a center line of the optical waveguide may be 20 μm or more and 60 μm or less, and a length in a direction along the optical waveguide of the mask may be 5 μm or more and 200 μm or less.

In the example semiconductor laser device manufacturing method, the active layer may be a nitride semiconductor layer containing indium.

In the example semiconductor laser device manufacturing method, in step (b), the semiconductor multilayer structure may be made of a nitride semiconductor having a {0001} plane as a main surface. In step (c), the optical waveguide may be formed in a <1-100> direction.

Advantages of the Invention

According to the semiconductor laser device of the present disclosure and the method for manufacturing semiconductor laser device, a facet window structure can be formed without impurity diffusion, ion implantation, or the like, and even when a nitride semiconductor is used, a semiconductor laser device having a facet window structure can be provided.

DESCRIPTION OF EMBODIMENTS

Figure 1A:
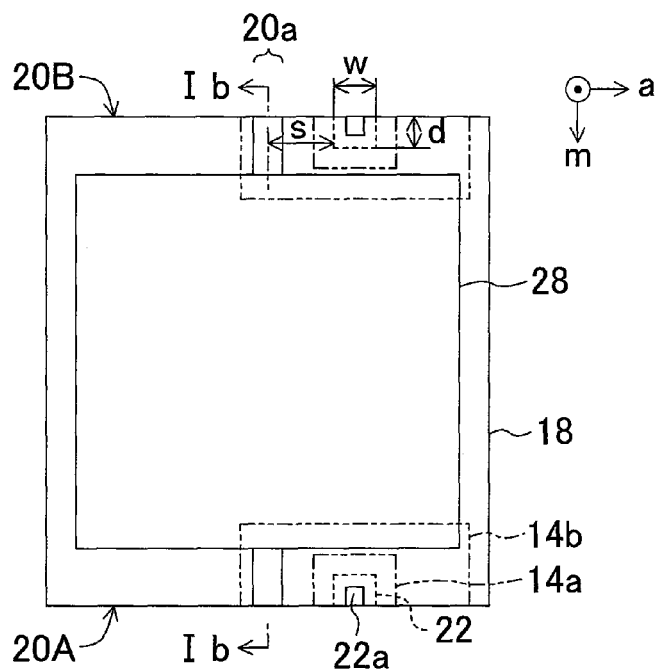
FIG. 1A is a plan view of a semiconductor laser device according to an embodiment.
Figure 1B:
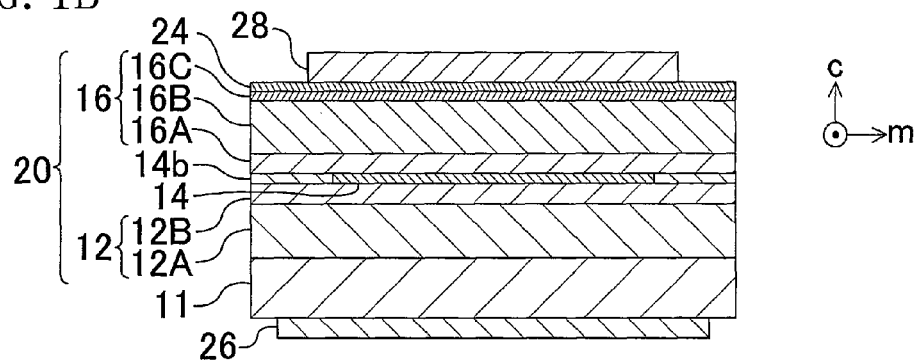
FIG. 1B is a cross-sectional view of the semiconductor laser of the embodiment, taken along line Ib-Ib of FIG. 1A.
Figure 1C:
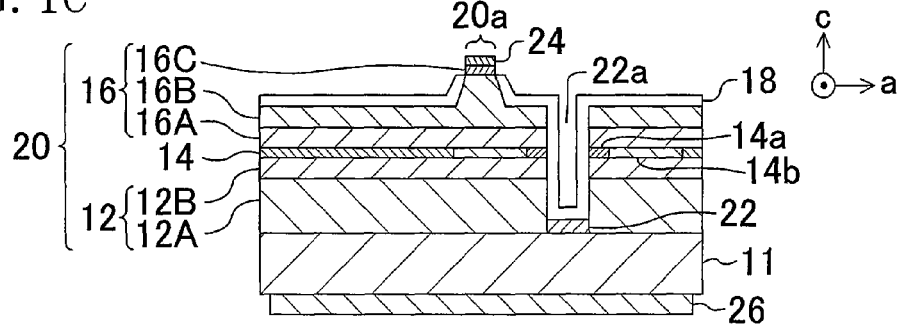
FIG. 1C is a cross-sectional view of the semiconductor laser of the embodiment, taken at a front facet thereof.

An embodiment will be described with reference to the accompanying drawings. FIG. 1A is a plan view of a semiconductor laser device according to an embodiment. FIG. 1B is a cross-sectional view of the semiconductor laser of the embodiment, taken along line Ib-Ib of FIG. 1A. FIG. 1C is a cross-sectional view of the semiconductor laser of the embodiment, taken at a front facet 20A thereof. In FIGS. 1A-1C, representative plane orientations of crystal of a nitride semiconductor in the hexagonal system are shown, where "c" indicates a plane equivalent to a {0001} plane or a vector normal to the {0001} plane, "a" indicates a plane equivalent to a {11-20} plane or a vector normal to the {11-20} plane, and "m" indicates a plane equivalent to a {1-100} plane or a vector normal to the {1-100} plane. As used herein, the minus sign "−" added to a Miller index in a plane orientation indicates the reciprocal of the index following the minus sign for the sake of convenience. Note that the front facet is one of the two facets of a cavity that has a larger light output, and a rear facet is the other facet, i.e., a facet opposite to the front facet, that has a smaller light output.

As shown in FIGS. 1A-1C, the semiconductor laser device of this embodiment is a nitride semiconductor laser device including a stripe-shaped ridge 20a. A mask 22 made of $SiO_2$ having a thickness of 400 nm is selectively formed on a predetermined region of a substrate 11 which is made of n-type GaN (n-GaN) and has a {0001} plane as its main surface. A semiconductor multilayer structure 20 is formed on the substrate 11 other than on the region where the mask 22 is formed. The semiconductor multilayer structure includes an n-type semiconductor layer 12, an active layer 14, and a p-type semiconductor layer 16, which are successively grown on the substrate 11 in this stated order.

The n-type semiconductor layer 12 includes an n-type cladding layer 12A made of n-$Al_{0.03}Ga_{0.97}N$ having a thickness of 2 µm, and an n-type light guiding layer 12B made of n-$Al_{0.003}Ga_{0.997}N$ having a thickness of 0.1 µm, which are successively grown. The multiple quantum well active layer 14 includes barrier layers each made of $In_{0.02}Ga_{0.98}N$ having a thickness of 8 nm and well layers made of $In_{0.12}Ga_{0.88}N$ having a thickness of 3 nm, which are alternately stacked one on top of the other. The p-type semiconductor layer 16 includes a p-type light guiding layer 16A made of p-GaN having a thickness of 0.1 µm, a p-type cladding layer 16B made of p-$Al_{0.03}Ga_{0.97}N$ having a thickness of 0.5 µm, and a contact layer 16C made of p-GaN having a thickness of 60 nm.

The p-type cladding layer 16B is etched, leaving a portion thereof, to form the stripe-shaped ridge 20a extending in the m-axis direction. The contact layer 16C is formed on the ridge 20a. A p-side electrode 24 is formed on the contact layer 16C, and an n-side electrode 26 is formed on a surface opposite to the semiconductor multilayer structure 20 of the substrate 11. A dielectric layer 18 is formed on an entire surface of the substrate 11, except for a region on the ridge 20a. A pad electrode 28 is formed extending over the p-side electrode 24 and the dielectric layer 18. The pad electrode 28 is spaced apart from the cavity facets and the cavity side surfaces.

A monocrystalline semiconductor layer is not grown on a portion of the substrate 11 on which the mask 22 is formed. Therefore, the semiconductor multilayer structure 20 has an opening 22a which is formed above the mask 22. Abnormal growth occurs in a region around the mask 22, i.e., crystal growth is faster in the region around the mask 22 than in the other region. As a result, a portion of the semiconductor multilayer structure 20 which is grown around the mask 22, has a surface morphology different from that of the other portion, and is raised.

Figure 2:
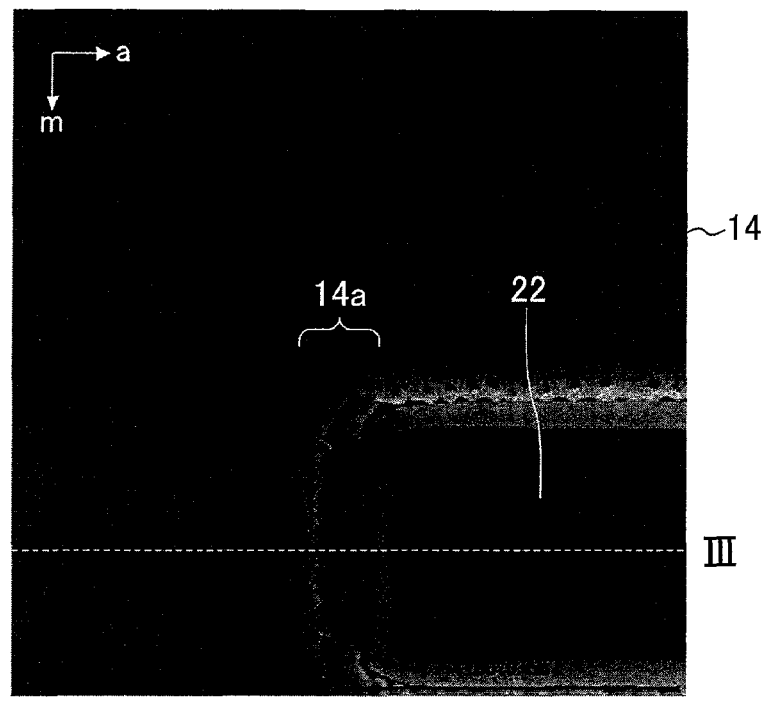
FIG. 2 shows a scanning electron micrograph showing a structure of an active layer formed in a region around a mask.

FIG. 2 shows the result of observation of the region around the mask 22 using a scanning electron microscope (SEM). Note that the semiconductor multilayer structure 20 as it was after the growth of the active layer 14, i.e., in which the p-type semiconductor layer 16 was not formed, was observed. As shown in FIG. 2, a monocrystalline semiconductor layer is not grown on a region of the substrate where the mask 22 is formed, so that an opening is formed through which the mask 22 is exposed (strictly speaking, because a thin polycrystalline semiconductor layer is formed on the mask 22, an opening is formed through which the polycrystalline semiconductor layer on a surface of the mask 22 is exposed). A portion of the active layer 14 which is grown at a peripheral edge of the mask 22, i.e., a portion of the active layer 14 which forms a side surface of the opening is an abnormal growth portion 14a having a surface morphology different from that of the other portion of the active layer 14. In the example shown in FIG. 2, the abnormal growth portion 14a has a width of about 30 µm extending from an end of the $SiO_2$ mask in the a-axis direction.

Figure 3:
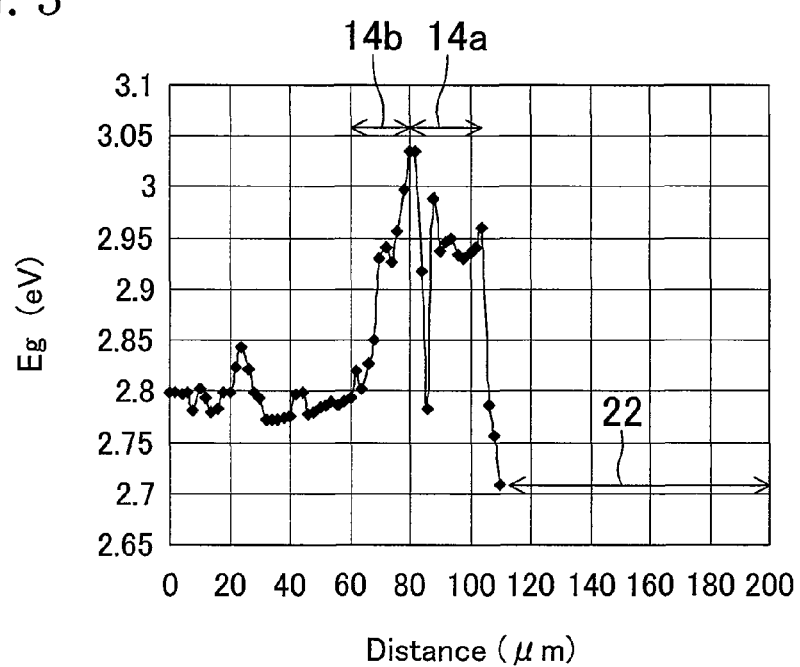
FIG. 3 shows a graph showing the result of measurement of the width of the forbidden band of the active layer formed in the region around the mask.

FIG. 3 shows the result of evaluation of the width of the forbidden band (Eg) of the active layer 14 along line III-III of FIG. 2 based on the emission peak wavelength of cathodoluminescence (CL). The active layer 14 has larger Eg values in a region thereof grown at the peripheral edge of the mask 22 than in the other region. The region having larger Eg values includes the abnormal growth portion 14a having a surface morphology different from that of the other portion, and a larger forbidden band width portion 14b in which a difference in surface morphology is not recognized. The abnormal growth portion 14a is formed closer to the mask 22 than the larger forbidden band width portion 14b is. A reason why the portion of the active layer 14 grown at the peripheral edge of the mask 22 has larger Eg values may be that the indium (In) content of the portion at the peripheral edge of the mask 22 is reduced during the growth. Therefore, in blue-violet laser devices having an emission wavelength of about 405 nm, the maximum increase in Eg may be about 330 meV. In green laser devices having an emission wavelength of about 540 nm, the maximum increase in Eg may be about 1100 meV.

In order to obtain the effect of sufficiently reducing or preventing COD, the width of the forbidden band at the facet window portion may be caused to be larger than that at a portion contributing to light emission by at least about 50 meV, preferably by 100 meV or more. The abnormal growth portion 14a formed at the peripheral edge of the mask 22 and the larger forbidden band width portion 14b sufficiently meet a condition which allows the effect of reducing or preventing COD. However, it is not preferable to form an optical waveguide, which guides light, in the abnormal growth portion 14a having a different surface morphology, because scattering is likely to increase. On the other hand, in the larger forbidden band width portion 14b in which a change in surface morphology is not recognized, it is possible to form a facet window structure at a position where the front facet of an optical waveguide is located. Note that the optical waveguide is assumed to indicate an entire region in which laser light is distributed. Specifically, in the case of ridge-type semiconductor laser devices, the optical waveguide includes not only the ridge, but also regions on lateral sides of the ridge in which laser light is distributed. In the case of buried-type semiconductor laser devices, the optical waveguide includes not only an opening in a current blocking layer, but also a region around the opening in which laser light is distributed.

In the semiconductor laser device of this embodiment, the optical waveguide is spaced apart from the abnormal growth portion 14a, and includes the larger forbidden band width portion 14b at the front facet 20A. Specifically, a position where the ridge 20a is formed and a position where the mask 22 is formed are adjusted so that the ridge 20a is spaced apart from the abnormal growth portion 14a of the active layer 14, and the larger forbidden band width portion 14b is formed in a region including the front facet 20A below the ridge 20a. As a result, the larger forbidden band width portion 14b is formed in a region which is located below the ridge 20a and includes the front facet 20A in the optical waveguide formed in the vicinity of the ridge 20a, and functions as a facet window portion in which absorption of oscillating laser light is reduced or prevented.

In this embodiment, when the cavity length is 600 μm, a horizontal dimension of the mask 22 is assumed to be 20 μm square, and a distance between an end closer to the ridge 20a of the mask 22 and a longitudinal center line of the ridge 20a is assumed to be 40 μm. The mask 22 is formed so that an end surface thereof is exposed at the front facet 20A. As a result, a range within about 50 μm as measured from the front facet 20A, of at least a region below the ridge 20a of the active layer 14 is the larger forbidden band width portion 14b which has larger Eg values than those of a portion other than the abnormal growth portion 14a, i.e., a portion contributing to light emission. A portion below the ridge 20a of the larger forbidden band width portion 14b has larger Eg values than those of the portion contributing to light emission of the active layer 14 by about 150 meV as shown in FIG. 3, and therefore, can sufficiently reduce or prevent absorption of oscillating light to reduce or prevent COD.

The width of the abnormal growth portion 14a varies, depending on conditions for the growth of the semiconductor layer, such as temperature, a gas flow rate, and the like, and the orientation of crystal of the semiconductor layer, and the like. A position and a size of the mask 22 need to be determined, depending on manufacturing conditions. However, in order to prevent the optical waveguide which is formed below the ridge 20a, extending to the vicinity of the ridge 20a, from being formed in the abnormal growth portion 14a, an interval "s" between an end closer to the ridge 20a of the mask 22 and the longitudinal center line of the ridge 20a, i.e., an interval between the center line of the optical waveguide and the mask 22, may be preferably 20 μm or more, more preferably 30 μm or more. Moreover, when the distance from the mask 22 is excessively large, the portion below the ridge 20a of the active layer 14 does not become the larger forbidden band width portion 14b. Therefore, the interval "s" between the end closer to the ridge 20a of the mask 22 and the center line of the ridge 20a may be preferably 60 μm or less, more preferably 50 μm or less.

In order to form the larger forbidden band width portion 14b in a region including the front facet 20A, the mask 22 may be formed starting from the front facet 20A. Note that the mask 22 may be spaced apart the front facet 20A. In view of the extensity of the larger forbidden band width portion 14b, if the interval between the end closer to the front facet of the mask 22 and the front facet 20A is smaller than about 50 μm, the larger forbidden band width portion 14b reaches well the front facet 20A.

A length of the facet window portion is determined by a length "d" in a direction along the ridge 20a of the mask 22. Therefore, the length "d" of the mask 22 is preferably 5 μm or more. Note that, as the length "d" of the mask 22 increases, the effective length of the cavity decreases. Therefore, when the cavity length is about 600 μm, the length "d" of the mask 22 is preferably 200 μm or less. Note that the cavity length is typically set to various values ranging from about 200 μm to about 2000 μm, and the length "d" of the mask 22 may be adjusted, depending on the required effective length of the cavity. A width "w" in a direction along the front facet 20A of the mask 22 is not particularly limited. The width "w" of about 10 μm suffices. The width "w" may be 100 μm or less for the purpose of ease of formation. Note that the width "w" may be larger than 100 μm, or the mask 22 may reach a side surface of the cavity, and these situations do not raise a problem.

In FIGS. 1A-1C, the mask 22 is also formed on a side closer to a rear facet 20B opposite to the front facet 20A. However, a facet window structure do not necessarily need to be formed on the side closer to the rear facet 20B. Therefore, the mask 22 may be formed only on a side closer to the front facet 20A. The mask 22 may be formed on each of the opposite lateral sides of the ridge 20a. Moreover, the mask 22 is no longer required after the semiconductor multilayer structure 20 is grown. Therefore, the mask 22 may be removed after the semiconductor multilayer structure 20 is formed.

Figure 4A:
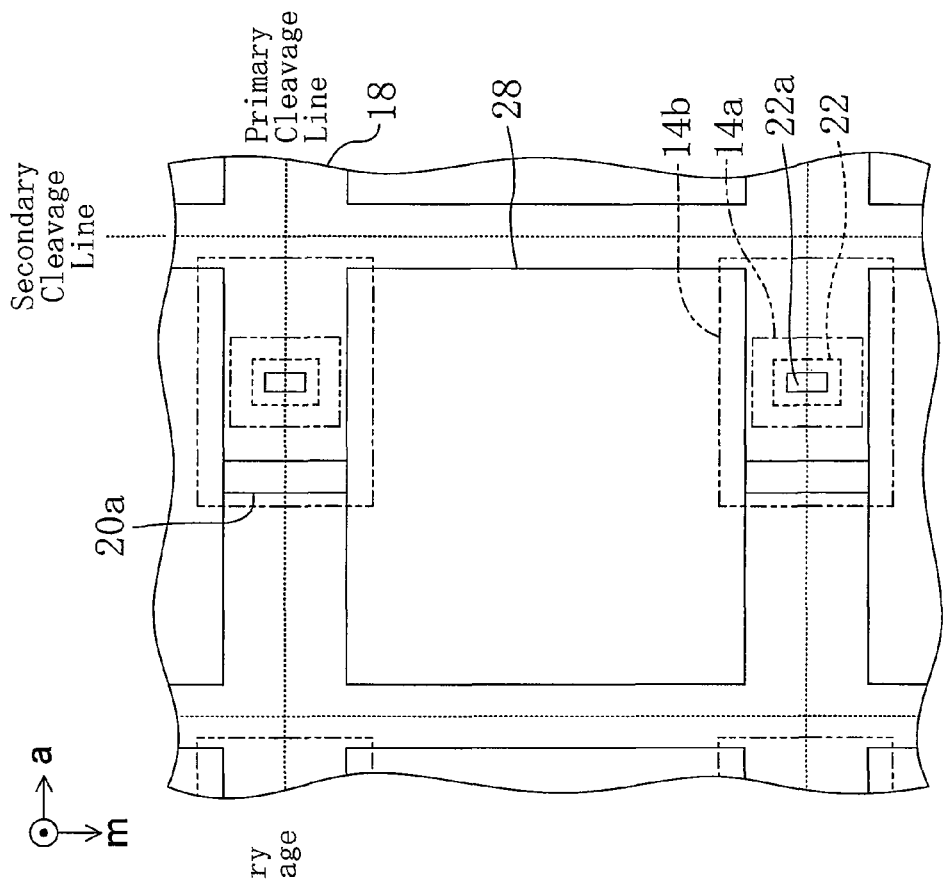
FIGS. 4A and 4B show plan views for describing a method for manufacturing the semiconductor laser device of the embodiment in the order in which the semiconductor laser device is manufactured.

The semiconductor laser device of this embodiment may be formed as follows. Initially, as shown in FIG. 4A, the mask 22 is formed on a predetermined region of the substrate 11, and thereafter, the n-type cladding layer 12A, the n-type light guiding layer 12B, the active layer 14, the p-type light guiding layer 16A, the p-type cladding layer 16B, and the contact layer 16C are successively grown, to form the semiconductor multilayer structure 20. When the mask 22 is made of $SiO_2$, the mask 22 may be formed by thermal chemical vapor deposition (thermal CVD) or the like. The semiconductor multilayer structure 20 may be formed by metal organic chemical vapor deposition (MOCVD), molecular beam epitaxy (MBE), or the like. When MOCVD is used, trimethyl gallium (TMG), trimethyl indium (TMI), trimethyl aluminum (TMA), and ammonia ($NH_3$) may be used as Ga, In, Al, and N sources, respectively. Moreover, silane ($SiH_4$) gas is used as a Si source which is an n-type impurity, and bis(cyclopentadienyl)magnesium ($Cp_2Mg$) may be used as a Mg source which is a p-type impurity.

A portion grown at the peripheral edge of the mask 22 of the semiconductor multilayer structure 20 including the active layer 14 is the abnormal growth portion 14a which protrudes farther than the other portion due to abnormal growth. A portion around the abnormal growth portion 14a is the larger forbidden band width portion 14b which has a flat surface and has larger Eg values than those of a portion other than the abnormal growth portion 14a.

Figure 4B:
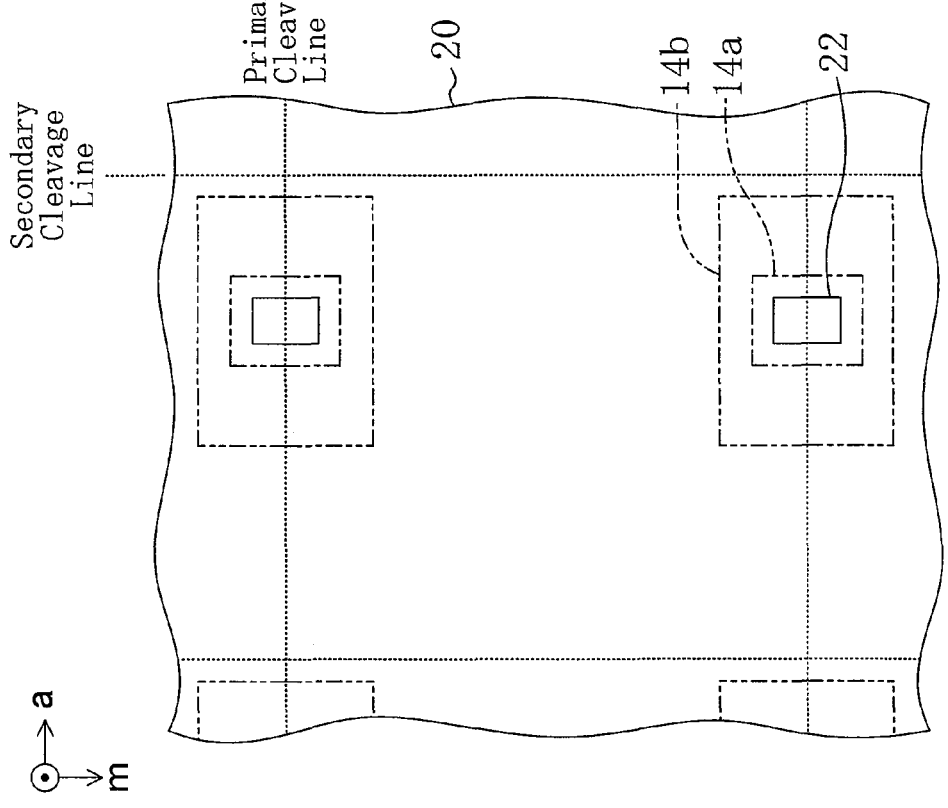

Next, a mask layer made of $SiO_2$ having a thickness of 0.2 μm is formed on the contact layer 16C by thermal CVD. The mask layer is patterned into the shape of a stripe having a width parallel to the m-axis direction of 1.5 μm by lithography and etching. Next, a portion of each of the contact layer 16C and the p-type cladding layer 16B is etched using an inductively coupled plasma (ICP) dry etching apparatus employing $Cl_2$ as etching gas. As a result, as shown in FIG. 4B, the stripe-shaped ridge 20a is formed. The ridge 20a is spaced apart from the abnormal growth portion 14a of the active layer 14 and is located on the larger forbidden band width portion 14b.

Next, the dielectric layer 18 for light confinement which is made of SiO$_2$ having a thickness of 400 nm is deposited by thermal CVD. An opening is formed in a region of the dielectric layer 18 including a top portion of the ridge 20a by photolithography and wet etching, and thereafter, the p-side electrode 24 made of palladium (Pd) having a thickness of 40 nm and platinum (Pt) having a thickness of 35 nm is formed by liftoff so that the p-side electrode 24 contacts a top portion of the ridge stripe. Thereafter, the pad electrode 28 made of titanium (Ti) having a thickness of 50 nm, a platinum (Pt) having a thickness of 35 nm, and a gold (Au) having a thickness of 500 nm is formed by liftoff.

Next, a back surface of the substrate 11 is ground or polished to a thickness of about 100 μm before the n-side electrode 26 made of Ti having a thickness of 5 nm, Pt having a thickness of 100 nm, and Au having a thickness of 1 μm is formed. Thereafter, a strip-shaped laser bar is formed by performing primary cleavage along a primary cleavage line. A facet coating is provided on a primary cleavage surface (cavity facet) for the purpose of control of the reflectance and protection of the facet before secondary cleavage is performed along a secondary cleavage line. As shown in FIG. 4B, if primary cleavage is performed along a cleavage line cutting laterally across the mask 22, a semiconductor laser device is obtained in which the larger forbidden band width portion 14b is formed at both of the front facet 20A and the rear facet 20B.

The mask 22 may be a silicon nitride film (SiN film) instead of the SiO$_2$ film. Alternatively, the mask 22 may be a high melting point metal film made of titanium (Ti), molybdenum (Mo), or the like. The accuracy of cleavage is higher when the primary cleavage line does not cut laterally across the mask 22 than when it does. Therefore, primary cleavage may be performed at a position where the mask 22 is not formed if the larger forbidden band width portion 14b will be exposed at the front facet. In this case, the mask 22 may be formed on both sides of the primary cleavage line.

The substrate on which the semiconductor multilayer structure 20 is formed may be a sapphire substrate, a silicon carbide (SiC) substrate, or the like instead of the GaN substrate. Moreover, while an example has been described in which the ridge 20a is formed extending in the m-axis direction, the ridge 20a may be formed extending in other crystal orientations.

In this embodiment, the ridge stripe-type semiconductor laser device has been described. However, similar advantages are obtained for buried-type semiconductor laser devices. In the case of buried-type semiconductor laser devices, for example, the opening in the current blocking layer may be formed so that the opening is spaced apart from the abnormal growth portion 14a of the active layer 14 and is located above the larger forbidden band width portion 14b at the front facet 20A.

In the semiconductor laser device of this embodiment, the facet window structure is formed from the larger forbidden band width portion which is formed by selective growth using a mask. Therefore, as is different from a facet window portion which is formed by impurity diffusion, ion implantation, or the like, a metal impurity for amorphizing, such as Zn or the like, is not diffused in the larger forbidden band width portion. Therefore, the larger forbidden band width portion of the active layer and the portion contributing to light emission of the active layer both contain substantially no impurity, and if an impurity is contained, the impurity content is substantially constant.

INDUSTRIAL APPLICABILITY

The semiconductor laser device of the present disclosure and the method for manufacturing the semiconductor laser device allow formation of a facet window structure without impurity diffusion, ion implantation, or the like, and provides a semiconductor laser device having a facet window structure even when a nitride semiconductor is used. The present disclosure is particularly useful for semiconductor laser devices which employ a nitride semiconductor and can be used as light sources for optical disks, light sources for laser display, and the like, and methods for manufacturing the semiconductor laser devices.

DESCRIPTION OF REFERENCE CHARACTERS

11 Substrate
12 n-type Semiconductor Layer
12A n-type Cladding Layer
12B n-type Light Guiding Layer
14 Active Layer
14a Abnormal Growth Portion
14b Larger Forbidden Band Width Portion
16 p-type Semiconductor Layer
16A p-type Light Guiding Layer
16B p-type Cladding Layer
16C Contact Layer
18 Dielectric Layer
20 Semiconductor Multilayer Structure
20A Front Facet
20B Rear Facet
20a Ridge
22 Mask
22a Opening
24 p-side Electrode
26 n-side Electrode
28 Pad Electrode

The invention claimed is:
1. A semiconductor laser device comprising:
a semiconductor multilayer structure selectively grown on a substrate other than on a predetermined region of the substrate,
wherein the semiconductor multilayer structure includes a cladding layer of a first conductivity type, an active layer, and a cladding layer of a second conductivity type, and has a stripe-shaped optical waveguide extending in a direction intersecting a front facet through which light is emitted,
the active layer has an abnormal growth portion formed at a peripheral edge of the predetermined region, and a larger forbidden band width portion formed around the abnormal growth portion and having a larger width of a forbidden band than that of a portion other than the abnormal growth portion of the active layer, and
the optical waveguide is spaced apart from the abnormal growth portion and includes the larger forbidden band width portion at the front facet, and
a length of the predetermined region in a direction along the optical waveguide is smaller than a length of the optical waveguide.

2. The semiconductor laser device of claim 1, wherein a mask which reduces or prevents the growth of the semiconductor multilayer structure is formed on the predetermined region of the substrate.

3. The semiconductor laser device of claim 2, wherein the mask is made of a dielectric material or a high melting point metal.

4. The semiconductor laser device of claim 1, wherein the semiconductor multilayer structure has an opening formed on the predetermined region.

5. The semiconductor laser device of claim 1, wherein
a distance between an end closer to the front facet of the predetermined region and the front facet is 50 μm or less,
a distance between an end closer to the optical waveguide of the predetermined region and a center line of the optical waveguide is 20 μm or more and 60 μm or less, and
a length in a direction along the optical waveguide of the predetermined region is 5 μm or more and 200 μm or less.

6. The semiconductor laser device of claim 1, wherein the abnormal growth portion is formed on both lateral sides of the optical waveguide.

7. The semiconductor laser device of claim 1, wherein the larger forbidden band width portion is formed in a region including the front facet of the optical waveguide, and in a region including a rear facet opposite to the front facet of the optical waveguide.

8. The semiconductor laser device of claim 1, wherein the active layer is a nitride semiconductor layer containing indium.

9. The semiconductor laser device of claim 1, wherein
the semiconductor multilayer structure is made of a nitride semiconductor having a {0001} plane as a main surface, and
the optical waveguide is formed in a <1-100> direction.

10. A method for manufacturing a semiconductor laser device, comprising the steps of:
(a) forming a mask on a predetermined region of a substrate;
(b) growing a semiconductor multilayer structure including an active layer on the substrate on which the mask is formed;
(c) forming a stripe-shaped optical waveguide spaced apart from a region where the mask is formed; and
(d) forming facets facing in a direction intersecting the optical waveguide by cleavage,
wherein in step (b), an abnormal growth portion is formed in the active layer at a peripheral edge of the mask due to abnormal growth, and a larger forbidden band width portion having a larger width of a forbidden band than that of a portion other than the abnormal growth portion of the active layer is formed around the abnormal growth portion,
in step (c), the optical waveguide is formed so that the optical waveguide is spaced apart from the abnormal growth portion and includes the larger forbidden band width portion,
in step (d), the cleavage is performed along a cleavage line cutting laterally across the predetermined region so that the larger forbidden band width portion is exposed at a front one of the facets, light being emitted through the front facet, and
a length of the predetermined region in a direction along the optical waveguide is smaller than the length of the optical waveguide.

11. The method of claim 10, wherein
in step (b), a cladding layer of a first conductivity type is formed between the substrate and the active layer, and a cladding layer of a second conductivity type is formed on the active layer, and
in step (c), a stripe-shaped ridge is formed by selectively etching the cladding layer of the second conductivity type.

12. The method of claim 10, wherein
in step (b), a cladding layer of a first conductivity type is formed between the substrate and the active layer, and a lower cladding layer of a second conductivity type and a current blocking layer are successively formed on the active layer, the lower cladding layer of the second conductivity type being lower than the current blocking layer, and
in step (c), a stripe-shaped opening is formed by selectively etching the current blocking layer before an upper cladding layer of the second conductivity type is formed and embedded in the opening.

13. The method of claim 10, further comprising the step of:
(e) after step (b), removing the mask.

14. The method of claim 10, wherein in step (b), the semiconductor multilayer structure is grown so that an opening is formed on the mask.

15. The method of claim 10, wherein the mask is made of a dielectric material or a high melting point metal.

16. The method of claim 10, wherein in step (a), a distance between an end closer to the front facet of the mask and the front facet is 50 μm or less, a distance between an end closer to the optical waveguide of the mask and a center line of the optical waveguide is 20 μm or more and 60 μm or less, and a length in a direction along the optical waveguide of the mask is 5 μm or more and 200 μm or less.

17. The method of claim 10, wherein the active layer is a nitride semiconductor layer containing indium.

18. The method of claim 10, wherein
in step (b), the semiconductor multilayer structure is made of a nitride semiconductor having a {0001} plane as a main surface, and
in step (c), the optical waveguide is formed in a <1-100> direction.

19. The semiconductor laser device of claim 1, wherein the predetermined region is formed on an end surface of the substrate.

* * * * *